United States Patent
Midtgaard et al.

(10) Patent No.: US 7,062,236 B2
(45) Date of Patent: Jun. 13, 2006

(54) TRANSMITTER CIRCUITS

(75) Inventors: Jacob Midtgaard, Fredensborg (DK); Oluf Bagger, Copenhagen (DK)

(73) Assignee: Nokia Corporation, Espoo (FI)

( * ) Notice: Subject to any disclaimer, the term of this patent is extended or adjusted under 35 U.S.C. 154(b) by 837 days.

(21) Appl. No.: 10/020,897

(22) Filed: Dec. 19, 2001

(65) Prior Publication Data
US 2002/0090921 A1 Jul. 11, 2002

(30) Foreign Application Priority Data
Dec. 22, 2000 (GB) .................................. 0031550.7

(51) Int. Cl.
*H04Q 11/12* (2006.01)
(52) U.S. Cl. .................. 455/126; 455/127.1; 333/136; 333/129; 332/162
(58) Field of Classification Search ............ 455/127.1, 455/127.5, 126, 108, 115.1, 102; 330/136, 330/129; 375/297, 295; 332/162
See application file for complete search history.

(56) References Cited

U.S. PATENT DOCUMENTS 5,023,937 A * 6/1991 Opas ........................ 455/126
5,105,168 A 4/1992 DaSilva ..................... 331/2
5,420,536 A * 5/1995 Faulkner et al. ............ 330/149
5,847,602 A * 12/1998 Su ............................ 330/10

FOREIGN PATENT DOCUMENTS

| EP | 1 017 162 | | 7/1999 |
| JP | 403131105 A | * | 6/1991 |
| JP | 02000156796 A | * | 6/2000 |
| WO | 00/31881 | | 6/2000 |

OTHER PUBLICATIONS

European Search Report.

* cited by examiner

*Primary Examiner*—Melur Ramakrishnaiah
(74) *Attorney, Agent, or Firm*—Alston & Bird LLP (57) ABSTRACT

A polar loop transmitter includes separate phase and envelope paths providing a linearising scheme for an efficient non-linear power amplifier. Loop filters are included in each of the phase and envelope paths to enable the path characteristics to be matched to one another. A polar loop transmitter and other types of envelope elimination and restoration transmitters control the output envelope of the power amplifier by connecting the output of the envelope detector, or in an envelope feedback transmitter, the envelope error signal, to the bias control input of the power amplifier. The transmitter can further include compensation means for compensating for non-linearities in the envelope control means and a loss of feedback control detector to ensure that the feedback signal remains within acceptable limits.

17 Claims, 9 Drawing Sheets

TRANSMITTER CIRCUITS

FIELD OF THE INVENTION

The present invention relates to transmitter circuits, particularly but not exclusively to power amplifier linearising circuits such as envelope elimination and restoration transmitters and polar loop transmitters for use in portable communications devices such as mobile telephones.

BACKGROUND

The present trend in portable communications devices such as mobile telephones is to increasingly lightweight devices with increased talk-time between battery recharge cycles. Such developments require ever more efficient radio-frequency (RF) amplifiers to minimise power consumption. In cellular systems such as GSM, the modulation scheme is a constant amplitude scheme, also referred to as constant envelope modulation, which permits use of efficient non-linear amplifiers. However, recent types of communication system such as EDGE and UMTS use non-constant envelope modulation schemes. The drawback is that the amplification of non-constant envelope RF signals requires the use of linear power amplifiers, which are inherently less efficient. The lower power efficiency of linear amplifiers translates into higher power consumption and higher heat dissipation.

A variety of linearisation architectures and schemes exist, including fixed and adaptive pre-distortion, adaptive bias, envelope elimination and restoration, polar loop and cartesian loop transmitters. Details of such devices are shown in "Increasing Talk-Time with Efficient Linear PA's", IEE Seminar on TETRA Market and Technology Developments, Mann S, Beach M, Warr P and McGeehan J, Institution of Electrical Engineers, 2000, which is incorporated herein by reference. However, many of these devices and techniques are unsuitable for battery operated portable devices such as mobile telephones, or are incapable of meeting current RF design standards, such as the TETRA linearity standard, ETSI publication ETS 300 396-2; "Trans-European Trunked Radio (TETRA);-Voice plus Data (V+D)—Part 2: Air Interface (AI)"; March 1996.

Envelope elimination and restoration (EER) transmitters separate envelope and phase information from an input modulated signal. The phase information is then passed through a power amplifier as a constant envelope signal, permitting the use of efficient, non-linear amplifiers, while the envelope signal is added to the power amplifier output. Such circuits suffer from the inherent problem that the phase and envelope information propagates through separate paths, which introduces different delays on the phase and envelope components before they are combined again at the output of the transmitter. This leads to distortion of the modulation.

SUMMARY OF THE INVENTION

According to a first aspect of the invention, there is provided a polar loop transmitter comprising an envelope loop, a phase loop and means disposed within each of the phase and envelope loops configured to match the transfer characteristics of the phase and envelope loops. The matching means can comprise a loop filter in each of the phase and envelope loops. Each loop filter can be configured so that the transfer characteristics of the phase and envelope loops are matched over an operating frequency range of the transmitter circuit. For example, each loop filter can be configured so that the phase and envelope loops are of the same type and have substantially the same bandwidth and loop damping.

The envelope loop can include envelope control means for the output signal from a power amplifier which forms part of the polar loop transmitter circuit. The envelope control means can comprise a power supply modulator arranged to modulate the voltage supply of the power amplifier or can be implemented by the connection of an envelope detector to a bias control input of the power amplifier.

The polar loop transmitter according to the first aspect of the invention can further comprise compensation means disposed in the envelope loop for compensating for non-linearities in the envelope control means. It can further comprise a detector configured to detect loss of feedback control.

According to a first aspect of the invention, there is further provided a polar loop transmitter comprising a power amplifier for amplifying an input signal having input phase and envelope components to produce an output signal having output phase and envelope components, an envelope loop including elements configured to produce an envelope difference signal representative of the difference between the input and output envelope components, said envelope loop having a loop transfer characteristic, a phase loop including elements configured to produce a phase difference signal representative of the difference between the input and output phase components, said phase loop having a loop transfer characteristic and elements disposed within each of the phase and envelope loops configured to match the transfer characteristics of the phase and envelope loops.

According to a second aspect of the invention, there is provided an envelope elimination and restoration transmitter including a power amplifier having a bias control input, wherein the transmitter includes an envelope detector for detecting the envelope of an input signal and the output of the envelope detector is connected to the bias control input of the amplifier to control the output signal envelope.

By removing the need for a power supply modulator, the switching noise and limited efficiency associated with such modulators is removed. In addition, cost savings can be achieved, while creating EER transmitters with improved efficiency for linear modulation schemes.

The transmitter according to the second aspect can further comprise a slow power supply modulator configured to modulate the supply voltage to the power amplifier. The transmitter according to this aspect of the invention can include pre-distortion or envelope feedback to make the transmitter linear. Different solutions for the phase path such as offset loop and direct fractional synthesis can also be included.

According to a third aspect of the invention, there is provided an envelope feedback transmitter including a power amplifier operable to provide an output signal, means for controlling the envelope of the output signal and compensation means for compensating for non-linear characteristics of the envelope control means.

By combining tough and non-critical direct gain compensation with envelope feedback, high linearisation of the amplifier envelope transfer function can be achieved. This aspect of the invention can also be combined with any suitable solution for the phase path such as an offset loop or a direct fractional synthesis.

The envelope control means can comprise a modulator for modulating the voltage supply of the power amplifier. Alternatively, the feedback transmitter can further comprise means for providing a difference signal representative of the difference between input and output envelope components, wherein the difference signal is connected to a bias control input of the power amplifier to provide the envelope control means. The difference signal can be connected to the bias control input of the power amplifier via a loop filter.

The difference signal providing means can comprise a comparator arranged to receive signals from first and second envelope detectors for detecting the input and output envelope components respectively.

The compensation means is disposed between the output of the amplifier and the input to the comparator. The compensation means can comprise first and second compensation elements, the first compensation element being disposed between the first envelope detector and a first input to the comparator and the second compensation element being disposed between the second envelope detector and a second input to the comparator. The first and second compensation elements can be configured to have a large signal transfer function which approximates to the inverse of the large signal transfer function of the envelope control means.

The compensation means can also be disposed between the output of the comparator and the envelope control means. In this case, the compensation means can comprise a compensation element having a linear transfer function with variable gain and a non-linear gain control. The non-linear gain control can be connected to the output of either one of the first and second envelope detectors.

According to a fourth aspect of the invention, there is provided a feedback transmitter having means for providing a difference signal representative of the difference between input and feedback signals, comprising a detector configured to detect a loss of feedback control when the difference signal exceeds a predetermined threshold.

The feedback amplifier can be an envelope elimination and restoration transmitter, in which the detector comprises an amplitude detector configured to detect a loss of feedback control when the amplitude of the envelope error exceeds a predetermined threshold.

The feedback amplifier can further comprise a power amplifier for amplifying an input signal having input phase and envelope components to produce an output signal having output phase and envelope components and an envelope loop including elements configured to produce an envelope difference signal representative of the difference between the input and output envelope components, wherein the amplitude detector is configured to monitor the difference signal.

The feedback amplifier can also comprise a comparator for producing the difference signal, the comparator being configured to receive output signals from first and second envelope detectors.

The feedback amplifier can alternatively be a Cartesian transmitter in which the difference signal is representative of the difference between in-phase I input and feedback signals or quaternary Q input and feedback signals.

By detecting and acting on the loss of feedback control, the use of a circulator, or isolator, between the amplifier and impedance load is rendered unnecessary, so increasing efficiency and saving on cost.

According to the fourth aspect of the invention, there is further provided a method of detecting a loss of loop control in a feedback transmitter providing a difference signal representative of the difference between input and output signal components, comprising monitoring the difference signal and detecting a difference signal deviation greater than a predefined threshold.

The input and output signal components can comprise signal envelope components. The step of detecting a difference signal deviation can comprise detecting a difference signal amplitude greater than a predefined threshold.

The method can further include averaging the difference signal.

BRIEF DESCRIPTION OF THE DRAWINGS

Embodiments of the invention will now be described by way of example with reference to the accompanying drawings, in which.

DETAILED DESCRIPTION

Figure 1:
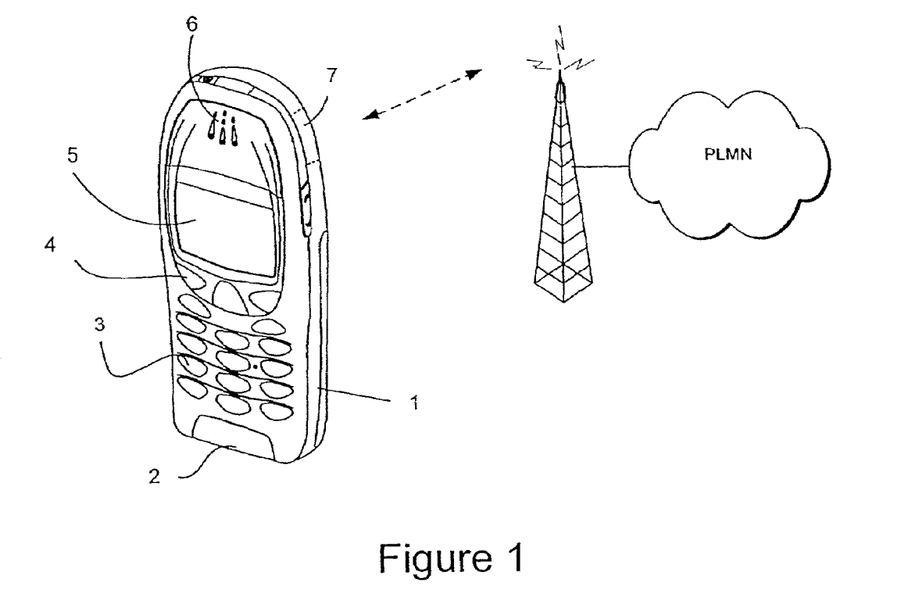
FIG. 1 is a perspective view of a mobile telephone handset.

Referring to FIG. 1, a mobile station in the form of a mobile telephone handset 1 includes a microphone 2, keypad 3, with soft keys 4 which can be programmed to perform different functions, an LCD display 5, a speaker 6 and an antenna 7 which is contained within the housing.

The mobile station 1 is operable to communicate through cellular radio links with individual public land mobile networks (PLMNs) operating according to communication schemes such as UMTS and EDGE.

Figure 2:
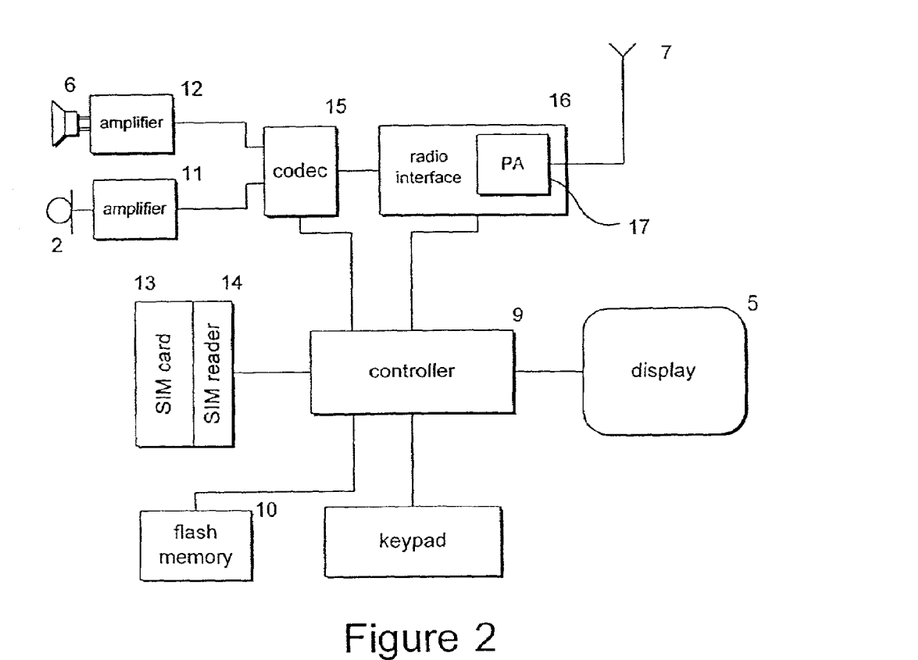
FIG. 2 is a schematic diagram of mobile telephone circuitry for use in the telephone handset of FIG. 1.

FIG. 2 illustrates the major circuit components of the telephone handset 1. Signal processing is carried out under the control of a digital micro-controller 9 which has an associated flash memory 10. Electrical analogue audio signals are produced by microphone 2 and amplified by preamplifier 11. Similarly, analogue audio signals are fed to the speaker 6 through an amplifier 12. The micro-controller 9 receives instruction signals from the keypad and soft keys 3, 4 and controls operation of the LCD display 5.

Information concerning the identity of the user is held on a smart card 13 in the form of a GSM SIM card which contains the usual GSM international mobile subscriber identity (IMSI) and an encryption key KI that is used for encoding the radio transmission in a manner well known per se. The SIM card is removably received in a SIM card reader 14.

The mobile telephone circuitry includes a codec 15 and an rf stage 16 including a power amplifier stage 17 feeding the antenna 7. The codec 15 receives analogue signals from the microphone amplifier 11, digitises them into an appropriate signal format and feeds them to the power amplifier stage 17 in the rf stage 16 for transmission through the antenna 7 to the PLMN shown in FIG. 1. Similarly, signals received from the PLMN are fed through the antenna 7 to be demodulated in the rf stage 16 and fed to codec 15, so as to produce analogue signals fed to the amplifier 12 and speaker 6.

Figure 3:
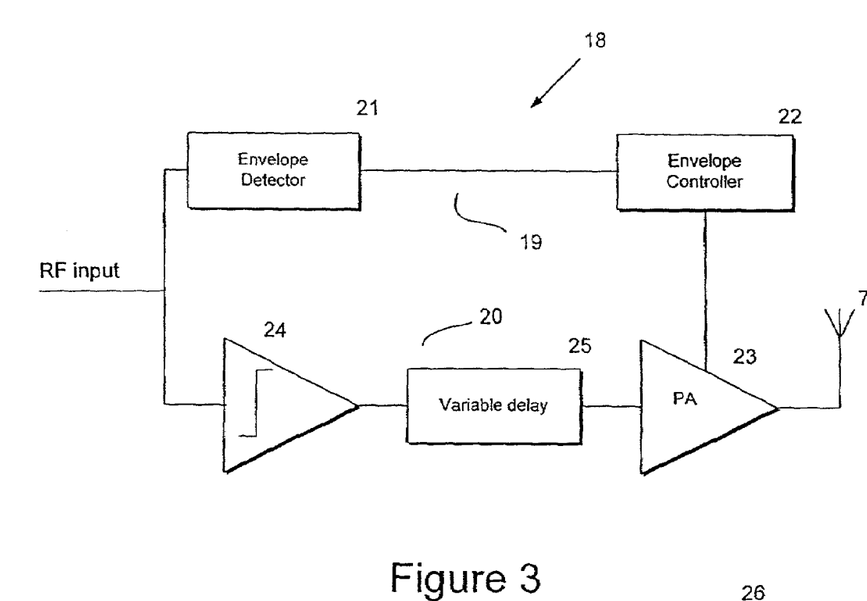
FIG. 3 illustrates the basic principle of an envelope elimination and restoration transmitter (EER)

Referring to FIG. 3, the power amplifier stage 17 comprises an envelope elimination and restoration (EER) transmitter 18 which separates the envelope and phase components of an input modulated RF signal into two separate paths 19, 20. The envelope path 19 includes an envelope detector 21 which extracts amplitude information from the RF input signal and an envelope controller 22 connected to a power amplifier 23. The phase path 20 includes a limiter 24 which eliminates the input signal envelope to generate a constant amplitude phase signal. The phase signal output of the limiter is fed to an RF input of the amplifier 23 via a variable delay module 25, while the amplitude information is used to control the output envelope via the envelope controller 22. The amplitude and phase information are therefore recombined via the power amplifier 23 to produce the RF output for the antenna 7. The envelope controller 22 is for example a fast power supply modulator which directly modulates the supply voltage of the power amplifier 23. The purpose of the delay module 25 is to compensate for the difference between envelope and phase path delays. However, this solution changes the loop characteristics and stability making it difficult to control. This is especially the case if a high bandwidth is needed for wideband modulation schemes such as the 8-PSK modulation used in EDGE, since the insertion of a delay can only match the loop transfer functions over a relatively narrow frequency band. Furthermore, it is difficult to ensure that the delay tracks loop changes with temperature and other variable conditions.

Figure 4:
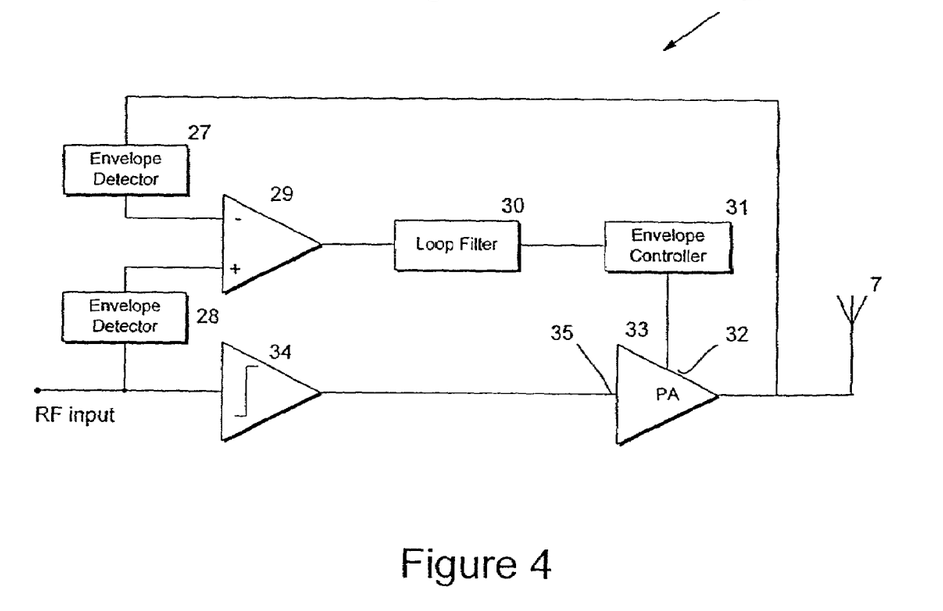
FIG. 4 shows an envelope feedback transmitter.

The addition of envelope feedback to the circuit of FIG. 3 leads to an envelope feedback transmitter 26, shown in FIG. 4. In general terms, the envelope feedback transmitter 26 works by comparing the output envelope with the input envelope and using the difference signal to control a power amplifier, thereby providing improved linearity. The envelope loop of the envelope feedback transmitter 26 comprises first and second envelope detectors 27, 28, the respective outputs of which are fed to the respective inputs of a comparator 29. The output of the comparator 29 is fed to a loop filter 30 and then via an envelope controller 31 to a voltage supply terminal 32 of a power amplifier 33. The phase loop of the envelope feedback transmitter is shown in its simplest form as comprising a limiter 34 which is fed with the RF input signal and has its output connected to an RF input 35 of the power amplifier 33. Since envelope feedback on its own does not correct AM-PM distortion, phase feedback is added to the circuit of FIG. 4 to provide an improved transmitter known as a polar loop transmitter or polar feedback transmitter 36, as shown in FIG. 5.

As well as comparing the input and output envelopes, the polar feedback transmitter compares the phases of the input and output signals and uses the resulting phase error to drive a voltage controlled oscillator.

Figure 5:
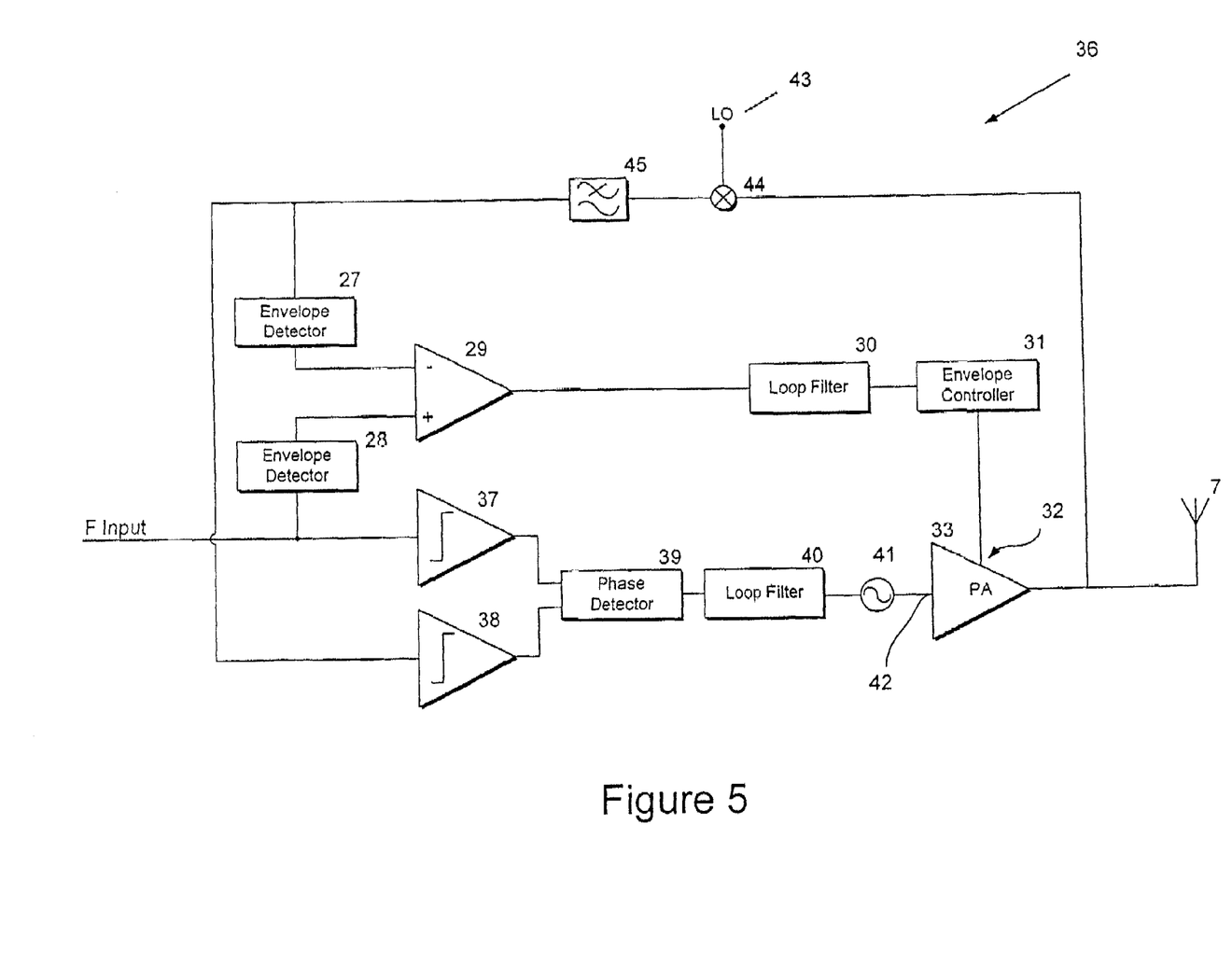
FIG. 5 shows a polar loop transmitter in accordance with the invention.

As described above in relation to FIG. 4, the envelope loop of the polar feedback transmitter 36 of FIG. 5 comprises first and second envelope detectors 27, 28, the respective outputs of which are fed to the respective inputs of the comparator 29. The output of the comparator 29 is fed to a first loop filter 30 and then via the envelope controller 31 to the voltage supply terminal 32 of the power amplifier 33. As mentioned above, the envelope controller 31 is, for example, a switching power supply which directly modulates the supply voltage of a switched mode power amplifier 33. The phase loop of the transmitter 36 comprises first and second limiters 37, 38 for producing a constant amplitude phase signal and a phase detector 39 for deriving a difference signal from the outputs of the limiters 37, 38. The output of the phase detector 39 is fed via a second loop filter 40 to a voltage controlled oscillator (VCO) 41, and then fed to an RF input 42 of the power amplifier 33. The output of the power amplifier 33 is mixed with a local oscillator signal 43 at a mixer 44 to shift the carrier frequency to an intermediate frequency and fed back through a low pass filter 45 as an input to the first envelope detector 27 and the second limiter 38. The purpose of the low pass filter 45 is to remove sideband components and local oscillator leakage from the mixed signal. The inputs to the second envelope detector 28 and the first limiter 37 are provided by the RF input signal.

The first and second loop filters 30, 40 are configured so that the loop characteristics of the phase and envelope loops are the same or very similar, with respect to both phase delay and gain, over the range of operating frequencies of the transmitter circuit. For example, both are type II loops with two poles at zero and both have the same bandwidth and loop damping. This results in similar group delays in the two loops, limiting the delay difference between the phase and envelope components.

Figure 6:
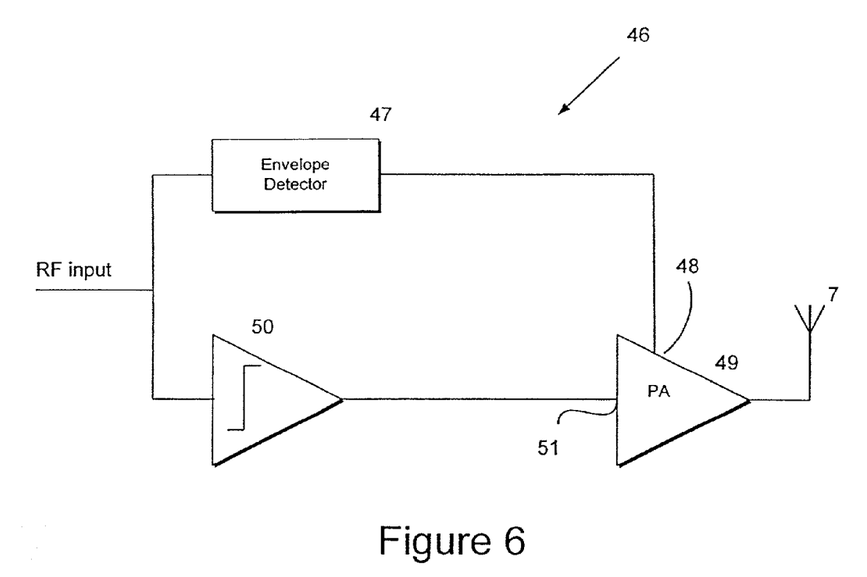
FIG. 6 is a schematic diagram of an EER transmitter using a bias input of a power amplifier in accordance with a second aspect of the invention.

In a second aspect of the invention illustrated in FIG. 6, a power supply modulator is not used to control the power supply of the power amplifier. The EER transmitter 46 comprises an envelope detector 47 which receives the input signal, the output of which is connected to the bias control input 48 of a power amplifier 49. In traditional non-EER transmitters, the bias control input is used to set the transmitter power level, while any envelope information is contained in the normal RF input signal to the power amplifier. In the phase loop, the input signal is connected via a limiter 50 to the RF input 51 of the amplifier 49. Comparing this circuit with the circuit of FIG. 3, it is apparent that this configuration obviates the need for a separate envelope controller.

While described above with reference to FIG. 6, the invention can be implemented in any EER transmitter architecture, including different solutions for the phase path such as offset loop and direct fractional synthesis. The transfer function for the bias control input to power amplifier envelope is generally non-linear. To make the transmitter linear, either pre-distortion or envelope feedback can be used. For example, the envelope controller 31 in FIGS. 4 and 5 can be omitted by using a bias control input on the power amplifier 33.

Figure 7:
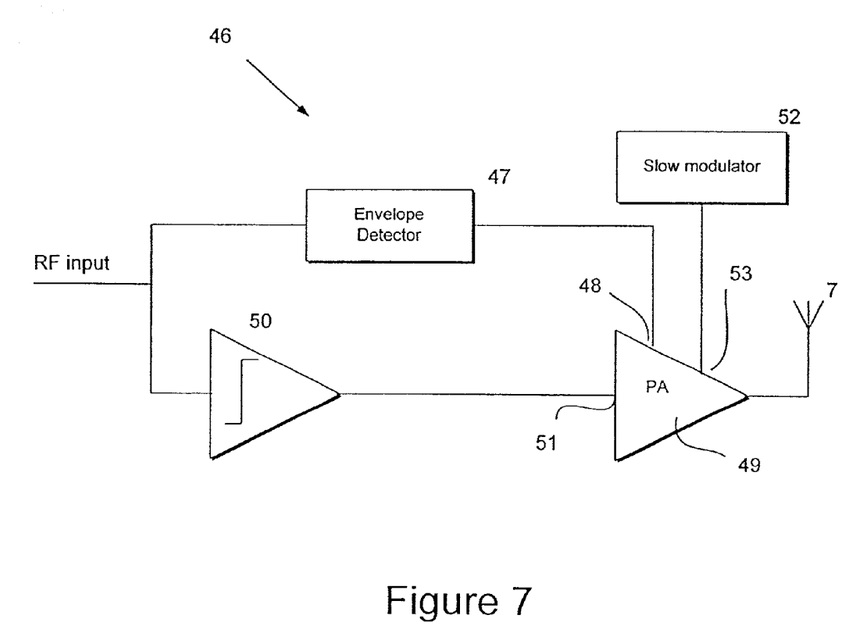
FIG. 7 is a schematic diagram of the transmitter of FIG. 6 with the addition of a slow modulator.

Referring to FIG. 7, this aspect of the invention can be combined with a slow power supply modulator 52, which has less switching noise problems than a fast power supply modulator and which can be implemented with higher efficiency. The modulator 52 is connected to a supply voltage terminal 53 of the power amplifier 49 and is used to set an optimum power supply voltage for a given output power level, while the bias control arrangement 47, 48 according to the second aspect handles the envelope variation due to modulation.

In a third aspect of the invention, compensation elements are added to EER circuits to compensate for non-linearities in the amplifier envelope control means.

Amplifier envelope control can be achieved using a variety of techniques, for example direct modulation of the amplifier supply voltage using a switched mode power supply or regulator, by controlling the bias conditions of the amplifier as described in relation to the second aspect above, by adding a variable gain amplifier on the input of the main amplifier or any combination of these.

Referring back to the circuit of FIG. 4, a compensation element can be added in two different places within the envelope loop. The first is between the output of the amplifier 33 and the input to the comparator 29, which requires a corresponding compensation element in the input path. The second is between the comparator 29 and the amplifier envelope control mechanism 31.

Figure 8:
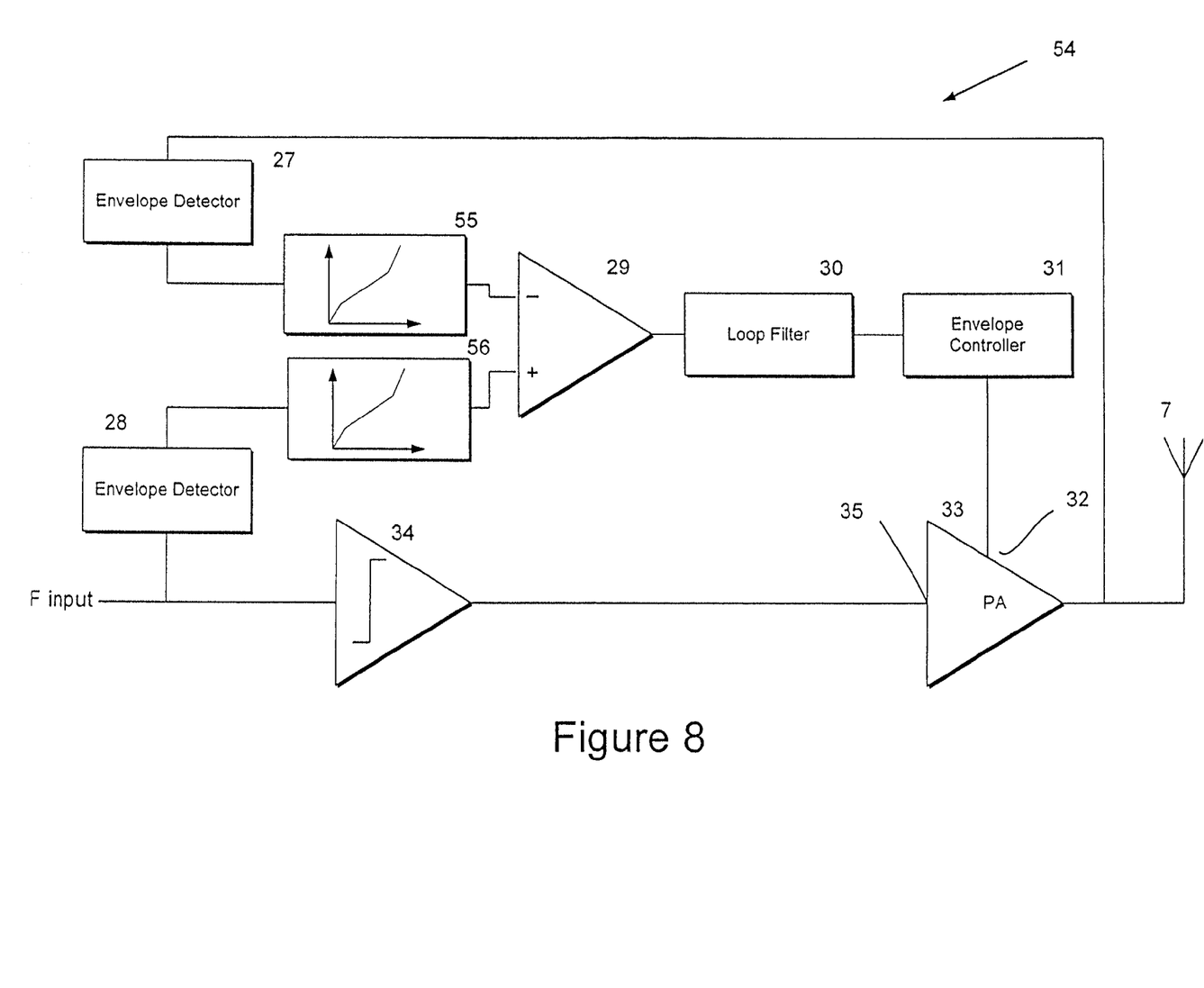
FIG. 8 is a schematic diagram of a first arrangement of an envelope feedback transmitter in accordance with a third aspect of the invention.
Figure 9:
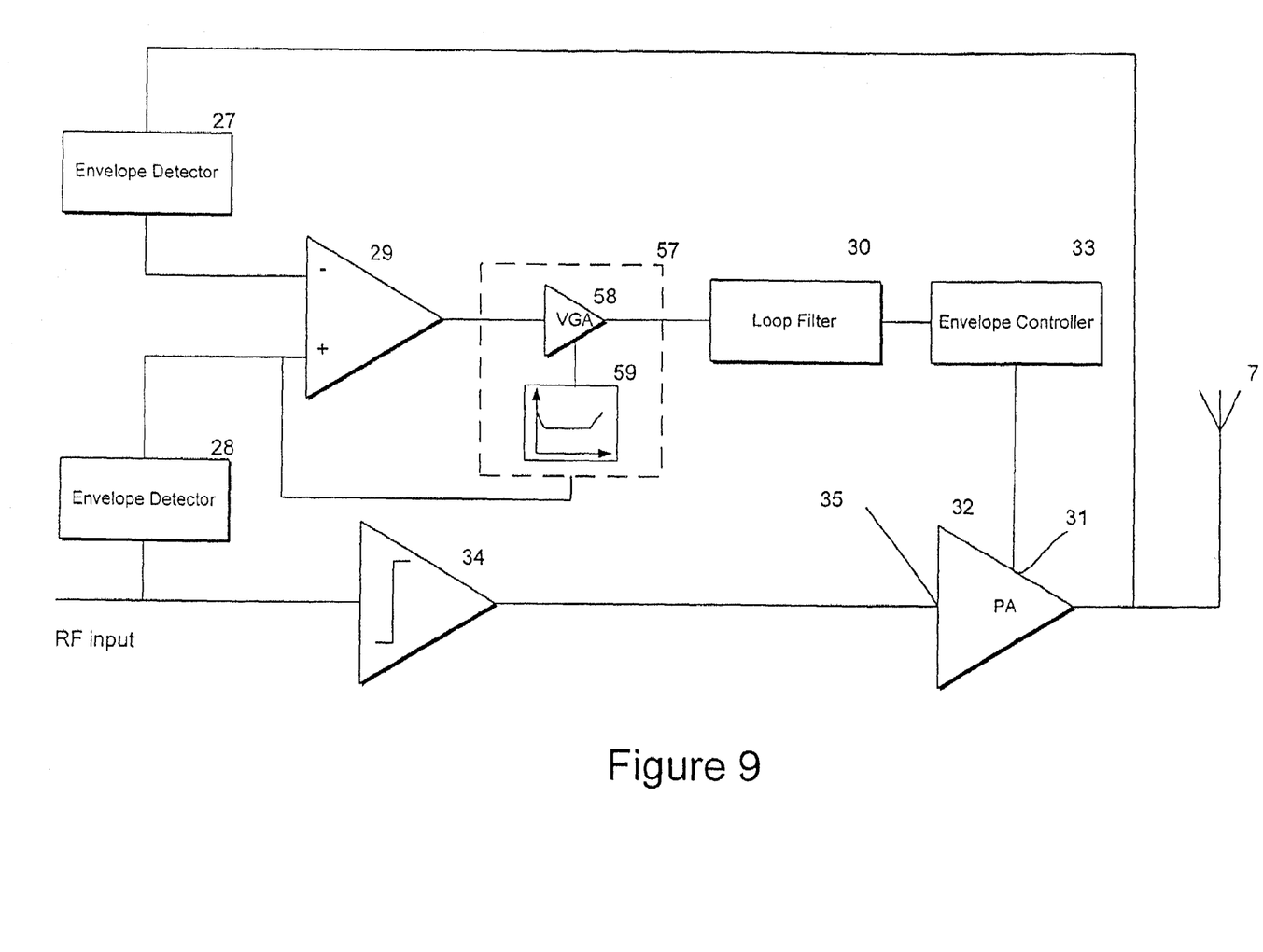
FIG. 9 is a schematic diagram of a second arrangement of an envelope feedback transmitter in accordance with a third aspect of the invention.

FIGS. 8 and 9 illustrate one way to place the compensating elements 55, 56, 57. The element referencing has been retained from that of FIG. 4 and the description of the overall circuit operation is the same. The compensation elements 55, 56 in the circuit of FIG. 8 are designed to have a large signal transfer function which approximates to the inverse of the envelope controller large signal transfer function. The compensation element 57 in the circuit of FIG. 9 is designed to have a linear transfer function using a variable gain amplifier 58 and a non-linear gain control 59. The gain in the compensation element 57 is then controlled by feeding the envelope information from one of the envelope detectors 28 forward to the gain control input of the compensation element. The non-linearity in the gain control 59 approximates to the inverse of the first derivative of the large signal transfer function of the envelope controller, or, in other words, approximates to the inverse of the envelope controller small signal gain as a function of the required envelope.

The exact shape of the non-linearity used to compensate the amplifier envelope control transfer function is not critical. It can, for example, be a piecewise linear characteristic, be comprised of exponential, linear and logarithmic segments, or hyperbolic tangent segments. The principle is to keep the resulting loop gain within boundaries, for example in the range 1:3 to 1:15, being the ratio between minimum and maximum loop gain over the modulation envelope variation, that allow the loop to compensate the remaining non-linearities without excessive requirements on loop gain and without excessive variation in loop characteristics as a result of the non-linearities.

Figure 10:
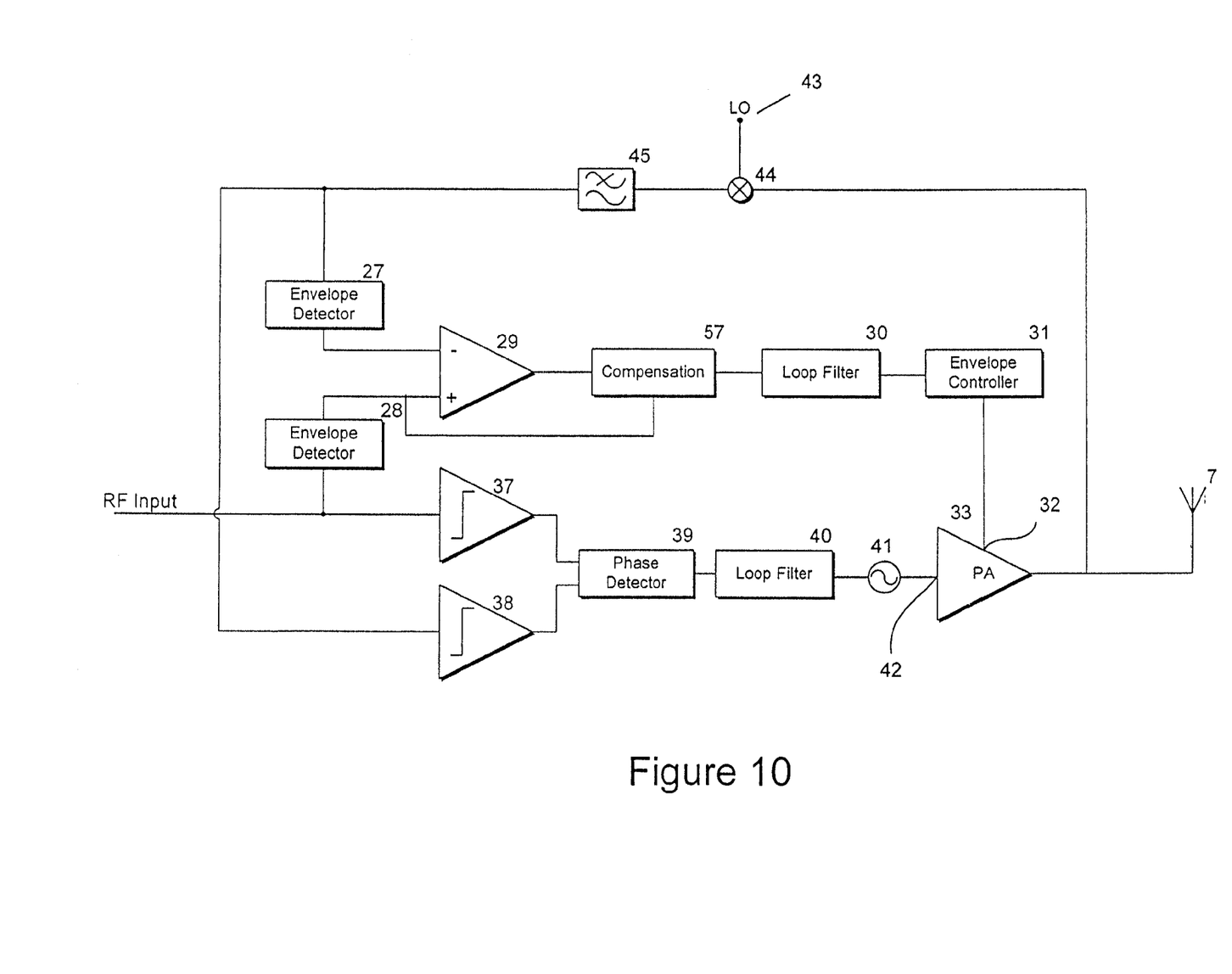
FIG. 10 is a schematic diagram of the envelope feedback transmitter of FIG. 8 with the addition of a phase offset loop.

The phase signal for this aspect of the invention can be generated in any way that is suitable for the specific modulation and system. Examples are an offset loop as shown in FIG. 10 and direct synthesis of the phase modulated RF signal using a fractional synthesis. The elements of FIG. 10 correspond to those shown and described in relation to FIG. 5, with the addition of the compensation element 57.

In normal operation, the output signal of the comparator in the envelope loop of an envelope feedback amplifier has a limited amplitude. However, the signal increases significantly in amplitude if the amplifier output envelope does not follow the input signal amplitude, for example due to clipping or saturation of the amplifier output stage, resulting in loss of feedback control. Clipping or saturation can occur as a result of an impedance mismatch and reflections caused, for example, by changes in the impedance of the antenna to which the amplifier output is connected.

Figure 11:
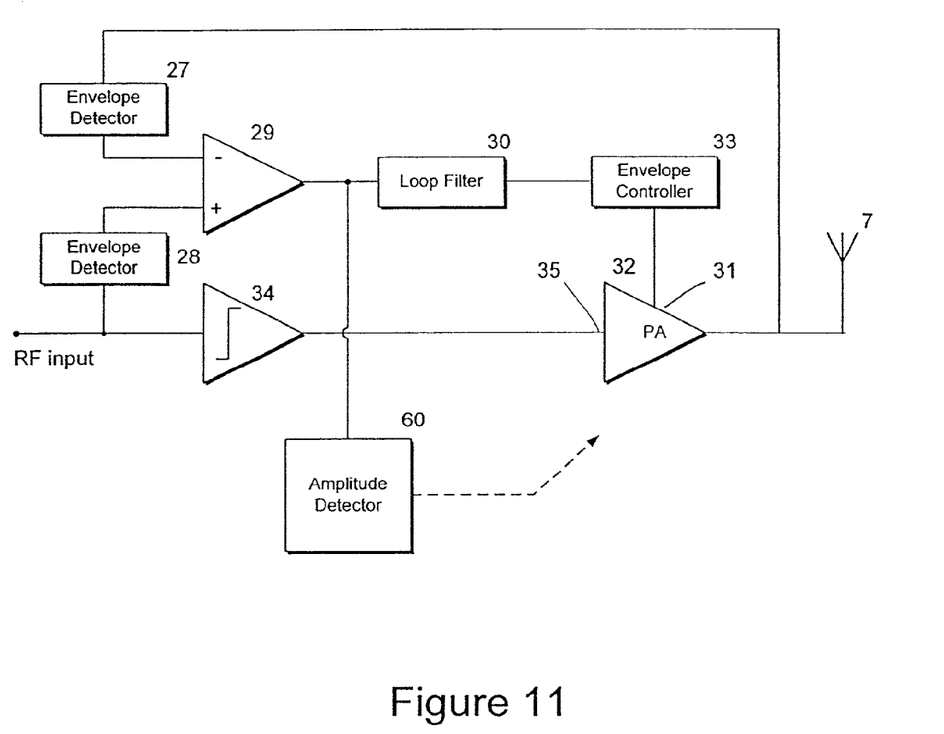
FIG. 11 is a schematic diagram of an envelope feedback transmitter with loss of feedback control detection according to a fourth aspect of the invention.
Figure 12:
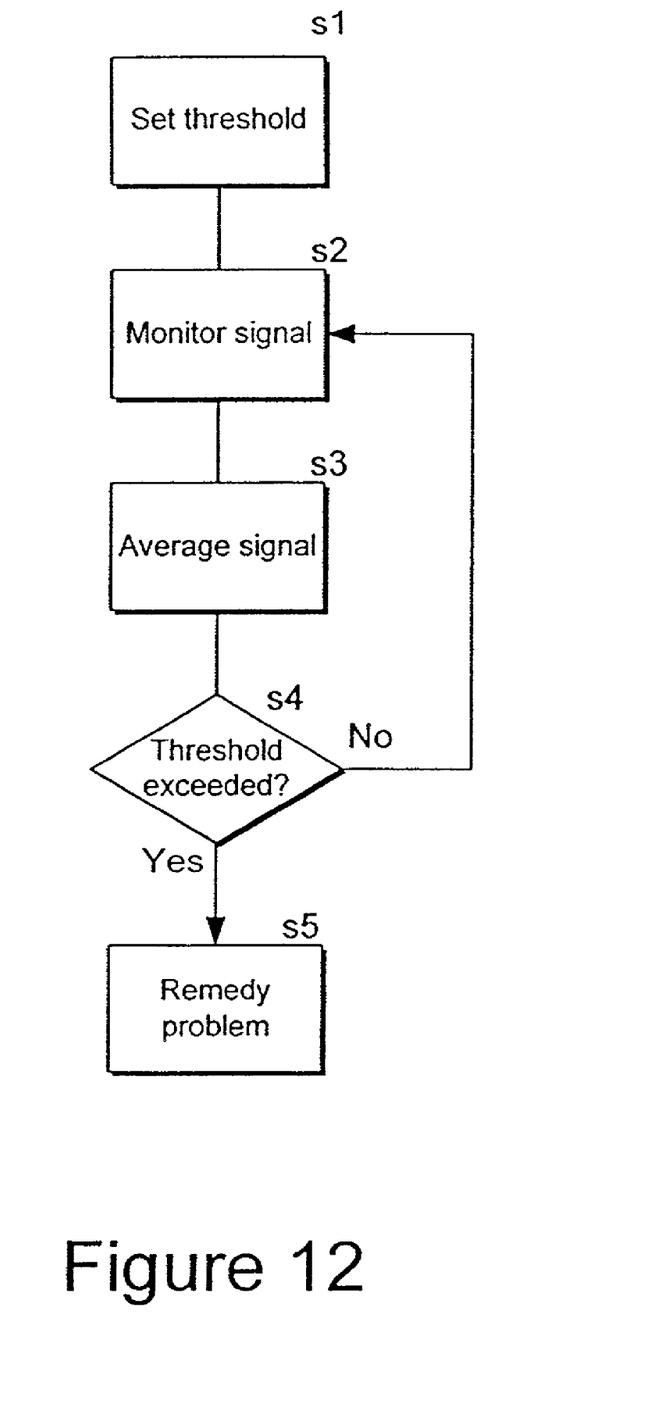
FIG. 12 is a flowchart illustrating the operation of the transmitter of FIG. 11.

FIG. 11 shows the EER transmitter of FIG. 4, with the addition of an amplitude detector 60 at the output of the comparator 29 in the envelope loop. All of the other elements shown and the general operation of the circuit are described above with reference to FIG. 4. The operation of the detector 60 is described below with reference to the flowchart in FIG. 12. A detection threshold is first set (step s1). This is set to be above the normal expected signal amplitude. The output of the comparator 29 is then continuously monitored (step s2) and the output averaged over a given period (step s3), to avoid detection of spurious amplitude spikes. If a loss of loop control is detected by the averaged comparator output signal exceeding the threshold for a given period (step s4), appropriate action is taken to remedy the problem (step s5).

The action to be taken depends on the cause of the loss of control. For example, if this is due to clipping or saturation in the amplifier output stage, the output power is lowered, avoiding modulation distortion at the cost of lower transmitted power. The loss of control detection can also be used to change the bias conditions or power supply of the amplifier, enabling it to cope with changes in load impedance. Modulation distortion can then be avoided while output power is maintained, at the possible cost of additional power consumption in the amplifier.

Detection can also be carried out at later stages in the forward envelope path, for example at nodes in the loop filter, or at any point at which the signal used for detection represents the envelope error and not the actual envelope.

While it has been described with respect to an envelope feedback amplifier, this aspect of the invention can also be used in other types of transmitter circuit, including a Cartesian feedback transmitter where detection can be done on the in-phase I or quaternary Q signal components. I and Q signals are generated in the feedback loop using a quadrature demodulator and compared directly to the wanted I and Q signals. The error signal from this comparison can be used to detect loss of control, in the same way as the error signal from the amplitude comparison in the polar loop architecture.

It will be understood that instead of separating the envelope and phase components in the input signal by envelope detection and limiting, as shown in the accompanying figures, the input signal can be directly supplied as polar phase and envelope components.

The invention claimed is:

1. A polar loop transmitter, comprising:
    an envelope loop;
    a phase loop; and
    components disposed within each of the phase and envelope loops configured to match the transfer characteristics of the phase and envelope loops, wherein said matching components comprise a loop filter in each of the phase and envelope loops, the polar loop transmitter being operable over an operating frequency range, wherein each loop filter is configured so that the transfer characteristics of the phase and envelope loops are matched over the operating frequency range.

2. A polar loop transmitter according to claim 1, including a power amplifier for providing an output signal, wherein the envelope loop includes an envelope control system for the output signal.

3. A polar loop transmitter according to claim 2, wherein the envelope control system includes a power supply modulator arranged to modulate the voltage supply of the power amplifier.

4. A polar loop transmitter according to claim 2, wherein the envelope loop includes an envelope detector.

5. A polar loop transmitter according to claim 4, wherein the envelope detector is connected to a bias control input of the power amplifier, whereby to provide the envelope control system.

6. A polar loop transmitter according to claim 2, further comprising compensation means disposed in the envelope loop for compensating for non-linearities in the envelope control system.

7. A polar loop transmitter according to claim 2, comprising first and second envelope detectors for detecting input and output envelopes respectively and a system for providing a difference signal representative of the difference between the input and output envelopes.

8. A polar transmitter according to claim 7, wherein said difference signal providing system comprises a comparator.

9. A polar loop transmitter according to claim 7, further comprising a detector configured to detect loss of feedback control.

10. A polar loop transmitter according to claim 9, wherein the detector is operative on the difference signal.

11. A polar loop transmitter comprising:
an envelope loop;
a phase loop; and
components disposed within each of the phase and envelope loops configured to match the transfer characteristics of the phase and envelope loops, wherein said matching components comprise a loop filter in each of the phase and envelope loops, wherein each loop filter is configured so that the phase and envelope loops are of the same type and have substantially the same bandwidth and loop damping.

12. A polar loop transmitter comprising:
a power amplifier for amplifying an input signal having input phase and envelope components to produce an output signal having output phase and envelope components;
an envelope loop including elements configured to produce an envelope difference signal representative of the difference between the input and output envelope components, said envelope loop having a loop transfer characteristic;
a phase loop including elements configured to produce a phase difference signal representative of the difference between the input and output phase components, said phase loop having a loop transfer characteristic; and
elements disposed within each of the phase and envelope loops configured to match the transfer characteristics of the phase and envelope loops.

13. A portable communications device including a polar loop transmitter composing:
a power amplifier for amplifying an input signal having input phase and envelope components to produce an output signal having output phase and envelope components;
an envelope loop including elements configured to produce an envelope difference signal representative of the difference between the input and output envelope components, said envelope loop having a loop transfer characteristic;
a phase loop including elements configured to produce a phase difference signal representative of the difference between the input and output phase components, said phase loop having a loop transfer characteristic; and
elements disposed within each of the phase and envelope loops configured to match the transfer characteristics of the phase and envelope loops.

14. An envelope feedback transmitter including a power amplifier providing an output signal;
a controller for controlling the envelope of the output signal; and
a compensator for compensating for non-linear characteristics of the envelope controller wherein the power amplifier has a bias control input the feedback transmitter further comprising a difference signal generator means for providing a difference signal representative of the difference between input and output envelope components, wherein the difference signal is connected to the bias control input of the power amplifier to provide the envelope control means, wherein the difference signal generator comprises a comparator arranged to receive signals from first and second envelope detectors for detecting the input and output envelope components respectively, wherein the compensator is disposed between the output of the amplifier and the input to the comparator, and wherein the compensator comprises first and second compensation elements, the first compensation element being disposed between the first envelope detector and a first input to the comparator and the second compensation element being disposed between the second envelope detector and a second input to the comparator.

15. An envelope feedback transmitter according to claim 14, wherein the first and second compensation elements have a large signal transfer function which approximates to the inverse of the large signal transfer function of the envelope control means.

16. An envelope feedback transmitter including a power amplifier providing an output signal,
a controller for controlling the envelope of the output signal; and
a compensator for compensating for non-linear characteristics of the envelope controller, wherein the power amplifier has a bias control input, the feedback transmitter further comprising a difference signal generator means for providing a difference signal representative of the difference between input and output envelope components, wherein the difference signal is connected to the bias control input of the power amplifier to provide the envelope control means, wherein the difference signal generator comprises a comparator arranged to receive signals from first and second envelope detectors for detecting the input and output envelope components respectively, wherein the compensator is disposed between the output of the comparator and the envelope controller, and wherein the compensation element has a linear transfer function with variable gain and a non-linear gain control.

17. An envelope feedback transmitter according to claim 16, wherein the non-linear gain control is connected to either one of the first and second envelope detectors.

* * * * *

UNITED STATES PATENT AND TRADEMARK OFFICE
CERTIFICATE OF CORRECTION

PATENT NO. : 7,062,236 B2
APPLICATION NO. : 10/020897
DATED : June 13, 2006
INVENTOR(S) : Midtgaard et al.

Page 1 of 1

It is certified that error appears in the above-identified patent and that said Letters Patent is hereby corrected as shown below:

<u>Column 9,</u>

Line 46, "composing" should read --comprising--.

Signed and Sealed this

Thirteenth Day of February, 2007

JON W. DUDAS
*Director of the United States Patent and Trademark Office*